United States Patent
Choi et al.

(10) Patent No.: US 10,192,949 B2
(45) Date of Patent: Jan. 29, 2019

(54) DISPLAY APPARATUS HAVING REDUCED DEFECTS

(71) Applicant: Samsung Display Co., Ltd., Yongin-Si, Gyeonggi-Do (KR)

(72) Inventors: Jonghyun Choi, Yongin-si (KR); Hyunsun Park, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/611,538

(22) Filed: Jun. 1, 2017

(65) Prior Publication Data

US 2017/0352717 A1 Dec. 7, 2017

(30) Foreign Application Priority Data

Jun. 2, 2016 (KR) ........................ 10-2016-0068852

(51) Int. Cl.
*H01L 51/00* (2006.01)
*H01L 27/32* (2006.01)
*H01L 27/12* (2006.01)

(52) U.S. Cl.
CPC ...... *H01L 27/3276* (2013.01); *H01L 51/0097* (2013.01); *H01L 27/1244* (2013.01)

(58) Field of Classification Search
CPC ............. H01L 27/3276; H01L 27/1244; H01L 51/0097; H01L 2251/5338
See application file for complete search history.

(56) References Cited

U.S. PATENT DOCUMENTS

| 8,698,189 | B2 | 4/2014 | Park et al. |
| 9,214,640 | B2 | 12/2015 | Lee et al. |
| 9,287,342 | B2 | 4/2016 | Kwon et al. |
| 2014/0232956 | A1 | 8/2014 | Kwon et al. |
| 2016/0285046 | A1* | 9/2016 | Son ..................... H01L 27/3276 |
| 2018/0092166 | A1* | 3/2018 | Kim ....................... H05B 33/04 |

FOREIGN PATENT DOCUMENTS

| KR | 10-2013-0007053 A | 1/2013 |
| KR | 10-2014-0103025 A | 8/2014 |
| KR | 10-2015-0074808 A | 7/2015 |

* cited by examiner

*Primary Examiner* — Caridad Everhart
(74) *Attorney, Agent, or Firm* — Innovation Counsel LLP

(57) ABSTRACT

A display apparatus capable of reducing defects such as disconnections during manufacturing processes, while ensuring longer lifespan thereof. The display apparatus includes: a substrate including a bending area between a first area and a second area, the bending area of the substrate being bent or bendable about a bending axis; an organic material layer positioned on the substrate corresponding at least to the bending area; a conductive layer extending from the first area to the second area through the bending area, positioned over the organic material layer, and including a plurality of through holes positioned corresponding to the bending area; and first protective layers spaced apart from one another so as to at least partially cover sides of the plurality of through holes.

23 Claims, 12 Drawing Sheets

… (1) …

DISPLAY APPARATUS HAVING REDUCED DEFECTS

CROSS-REFERENCE TO RELATED APPLICATION

This application claims the benefit of Korean Patent Application No. 10-2016-0068852 filed on Jun. 2, 2016 in the Korean Intellectual Property Office, the disclosure of which is incorporated herein in its entirety by reference.

BACKGROUND

1. Field

One or more embodiments relate generally to a display apparatus, and more particularly, to a display apparatus capable of reducing generation of defects such as disconnections during manufacturing processes.

2. Description of the Related Art

In general, a display apparatus includes a display unit fabricated on a substrate. Often, at least a part of the display apparatus may be bent in order to improve visibility at various angles, or to reduce the size of a non-display area.

However, in conventional display apparatuses, defects may occur or lifespan of the display apparatus may be reduced through processes of manufacturing bent display apparatuses.

SUMMARY

One or more embodiments include a display apparatus capable of reducing generation of defects such as disconnections during manufacturing processes, while facilitating longer lifespan of the display apparatus.

Additional aspects will be set forth in part in the description which follows and, in part, will be apparent from the description, or may be learned by one of ordinary skill in the art during practice of the presented embodiments.

According to one or more embodiments, a display apparatus includes: a substrate including a bending area between a first area and a second area, the bending area of the substrate being bent or bendable about a bending axis; an organic material layer positioned on the substrate corresponding at least to the bending area; a conductive layer extending from the first area to the second area through the bending area, positioned over the organic material layer, and including a plurality of through holes positioned corresponding to the bending area; and first protective layers spaced apart from one another so as to at least partially cover sides of the plurality of through holes.

The first protective layers may include an inorganic material.

The first protective layers may substantially completely cover the sides of the plurality of through holes.

The first protective layers may cover the sides of the plurality of through holes and an upper surface of the organic material layer, wherein the upper surface may be exposed via the plurality of through holes.

The conductive layer may have a multi-layered structure. The conductive layer may include a first conductive layer, a second conductive layer, and a third conductive layer that are sequentially stacked, a reactivity of the second conductive layer with an organic material is greater than a reactivity of the first conductive layer with an organic material and a reactivity of the third conductive layer with an organic material, and the first protective layers may at least cover portions of the sides corresponding to the second conductive layer.

The conductive layer may include a first conductive layer, a second conductive layer, and a third conductive layer. Within the through holes, surfaces of the second conductive layer may be recessed away from surfaces of the first conductive layer and the third conductive layer. The first protective layers may cover surfaces of the second conductive layer and at least one of the first and third conductive layers, and a portion of the first protective layers that covers the surface of the second conductive layer may be greater in thickness than a portion of the first protective layers that covers the surface of the at least one of the first and third conductive layers.

The display apparatus may further include second protective layers that are spaced apart from each other in the bending area so as to partially cover opposing outer surfaces of the conductive layer. The second protective layers may include an inorganic material.

A portion of the conductive layer that corresponds to the bending area has a lower surface and an upper surface, and the lower surface may have a width that is greater than a width of the upper surface.

The conductive layer may include a first conductive layer, a second conductive layer, and a third conductive layer that are stacked in order of increasing distance from the substrate, and in a portion corresponding to the bending area, the first conductive layer may have a width that is greater than a width of the third conductive layer. The second protective layers may at least partially cover opposing outer surfaces of the second conductive layer.

The through holes may be arranged in a row along a direction in which the conductive layer extends. A first edge of the conductive layer may include first concave portions positioned between adjacent through holes, and a second edge of the conductive layer may include second concave portions positioned between adjacent through holes. The second protective layers may cover the first concave portions and the second concave portions.

The through holes may be arranged along a direction, in which the conductive layer extends, and comprise a plurality of first through holes positioned to one side of a central axis of the conductive layer, and a plurality of second through holes positioned to another side of the central axis. The first through holes and the second through holes may be arranged in alternating manner along the direction in which the conductive layer extends. A first edge of the conductive layer may include first concave portions each positioned corresponding to one of the second through holes, and a second edge of the conductive layer may include second concave portions each positioned to correspond to one of the first through holes. The second protective layers may cover the first concave portions, and the second concave portions.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
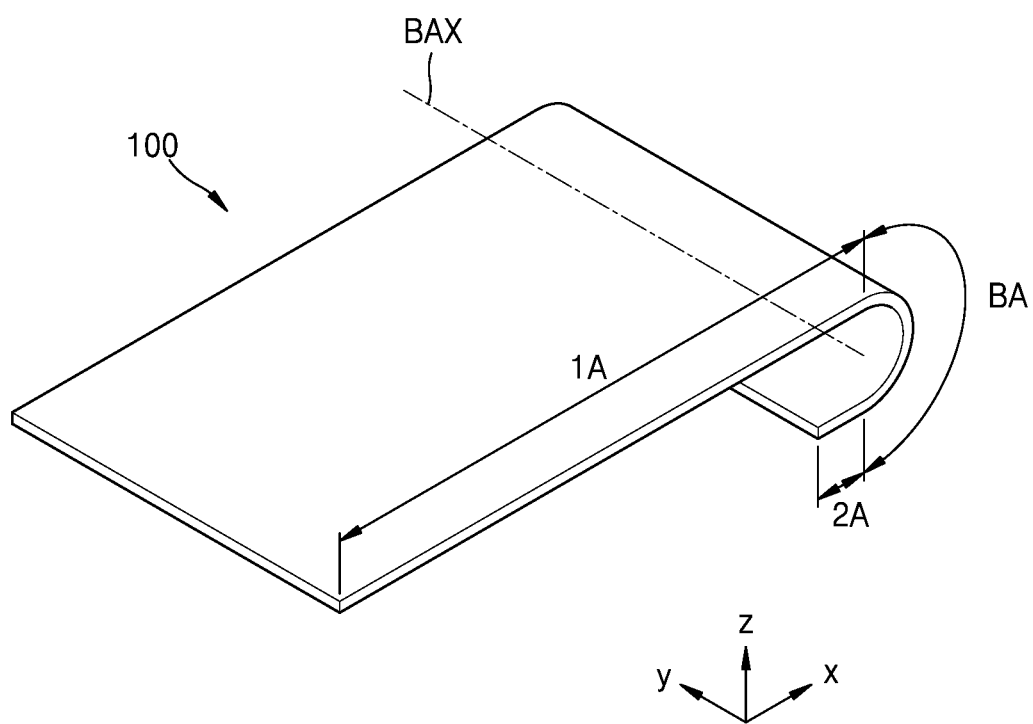
FIG. 1 is a schematic perspective view of a part of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the present disclosure will be described in detail by explaining preferred embodiments of the inventive concept with reference to the attached drawings. Like reference numerals in the drawings denote like elements.

Sizes of components in the drawings may be exaggerated for convenience of explanation. In other words, the various drawings are not necessarily to scale, and since sizes and thicknesses of components in the drawings are arbitrarily illustrated for convenience of explanation, the following embodiments are not limited thereto. All numerical values are approximate, and may vary. All examples of specific materials and compositions are to be taken as nonlimiting and exemplary only. Other suitable materials and compositions may be used instead.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
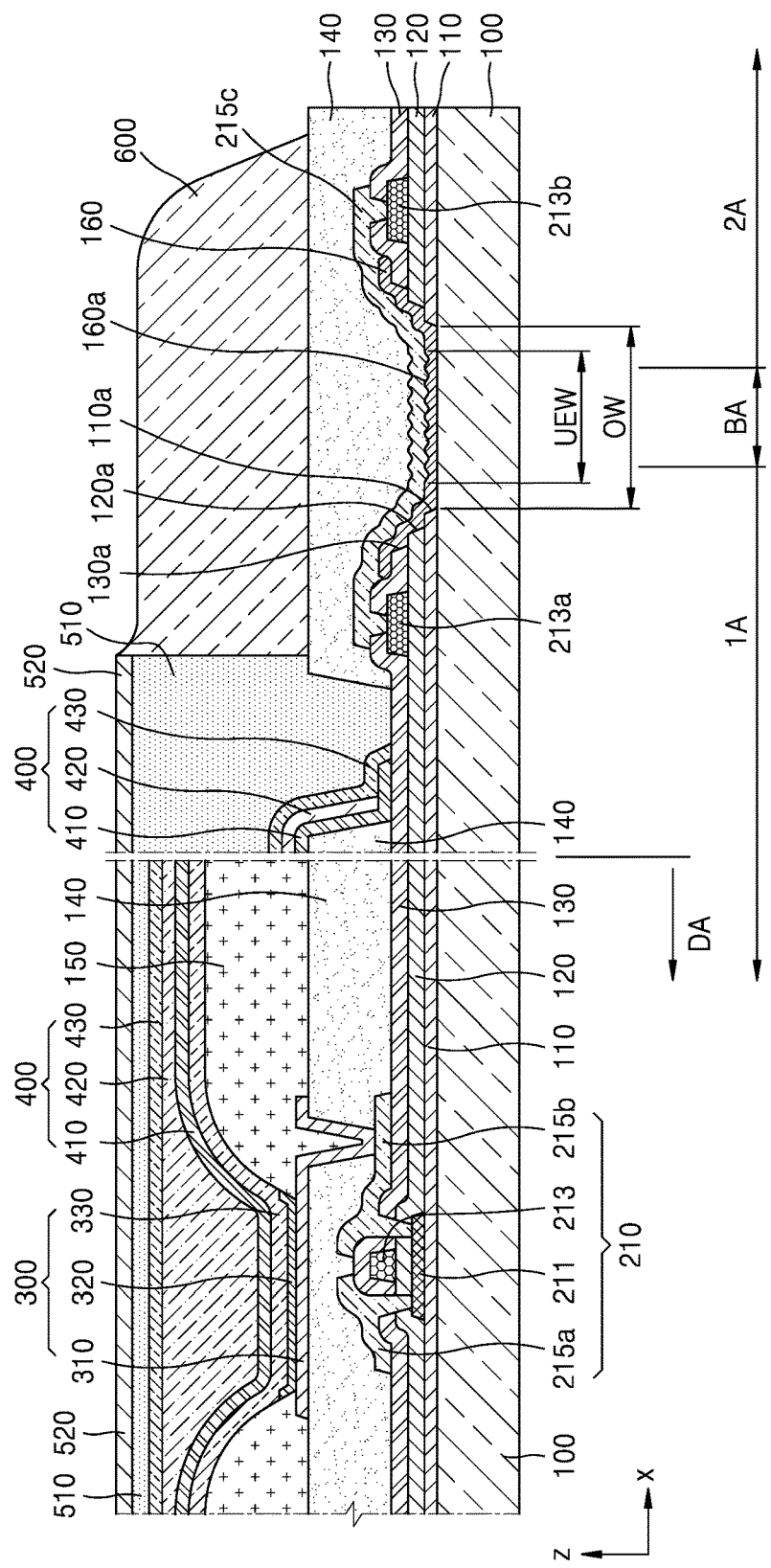
FIG. 2 is a schematic cross-sectional view of a part of the display apparatus of FIG. 1.

FIG. 1 is a schematic perspective view of a part of a display apparatus according to an embodiment, and FIG. 2 is a schematic cross-sectional view of a part of the display apparatus of FIG. 1.

In the display apparatus according to the embodiment, a substrate 100 that is a part of the display apparatus is partially bent, and thus, the display apparatus also has a partially bent shape like the substrate 100. For convenience of description, the display apparatus is not bent in FIG. 2. In some of the cross-sectional views or plan views associated with other embodiments that will be described later, display apparatuses may be shown as straight or unbent, for convenience of description.

As shown in FIGS. 1 and 2, the substrate 100 of the display apparatus according to the embodiment includes a bending area BA extending along a first direction (+y direction). The bending area BA is located between a first area 1A and a second area 2A in a second direction (+x direction) crossing the first direction. In addition, the substrate 100 is bent about a bending axis BAX that extends in the first direction (+y direction) as shown in FIG. 1. The substrate 100 may include various materials having flexible or bendable characteristics, e.g., one or more polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The first area 1A includes a display area DA. The first area 1A may further include a part of a non-display area outside the display area DA, as shown in FIG. 2. If necessary, the display area DA may extend to the bending area BA. The second area 2A also includes the non-display area.

On the display area DA of the substrate 100, a display device 300 and a thin film transistor 210 may be located, wherein the display device 300 is electrically connected to the thin film transistor 210 as shown in FIG. 2. In FIG. 2, an organic light-emitting device is located in the display area DA as the display device 300. The pixel electrode 310 is electrically connected to the thin film transistor 210. If desired, a thin film transistor (not shown) may also be on a peripheral area outside the display area DA of the substrate 100. The thin film transistor on the peripheral area may be, for example, a part of a circuit unit for controlling electric signals that are applied to the display area DA.

The thin film transistor 210 may include a semiconductor layer 211 including amorphous silicon, polycrystalline silicon, or an organic semiconductor material, a gate electrode 213, a source electrode 215a, and a drain electrode 215b. In order to ensure insulation between the semiconductor layer 211 and the gate electrode 213, a gate insulating layer 120 may be between the semiconductor layer 211 and the gate electrode 213, wherein the gate insulating layer 120 includes an inorganic material such as silicon oxide, silicon nitride, and/or silicon oxynitride. In addition, an interlayer insulating layer 130 may be on the gate electrode 213, and the source electrode 215a and the drain electrode 215b may be on the interlayer insulating layer 130, wherein the interlayer insulating layer 130 includes an inorganic material such as silicon oxide, silicon nitride, and/or silicon oxynitride. Inorganic insulating layers may be formed by chemical vapor deposition (CVD) or atomic layer deposition (ALD). This will be applied to other embodiments and modifications thereof that will be described later.

A buffer layer 110 may be between the thin film transistor 210 and the substrate 100. The buffer layer 110 may include an inorganic material such as silicon oxide, silicon nitride, and/or silicon oxynitride. The buffer layer 110 may improve smoothness of an upper surface of the substrate 100, or prevent or reduce infiltration of impurities from the substrate 100 into the semiconductor layer 211 of the thin film transistor 210.

A planarization layer 140 may be arranged on the thin film transistor 210. For example, as shown in FIG. 2, when the organic light-emitting device is arranged on the thin film transistor 210, the planarization layer 140 may planarize an upper portion of a protective layer that covers the thin film transistor 210. The planarization layer 140 may include, for example, an organic material such as acryl, benzocyclobutene (BCB), and hexamethyldisiloxane (HMDSO). In FIG. 2, although the planarization layer 140 is shown as having a single-layered structure, the planarization layer 140 may have various other configurations. For example, the planarization layer 140 may have a multi-layered structure. In addition, as shown in FIG. 2, the planarization layer 140 may have an opening outside the display area DA, so that a part of the planarization layer 140 in the display area DA and a part of the planarization layer 140 in the second area 2A may be physically separate from each other. Thus, impurities from an outside source may not reach the display area DA via the planarization layer 140.

In the display area DA of the substrate 100, the organic light-emitting device may be on the planarization layer 140. The organic light-emitting device includes the pixel electrode 310, an opposite electrode 330, and an intermediate layer 320 between the pixel electrode 310 and the opposite electrode 330. The intermediate layer 320 may include an emission layer. The pixel electrode 310 may contact one of the source electrode 215a and the drain electrode 215b via an opening formed in the planarization layer 140 and may be electrically connected to the thin film transistor 210, as shown in FIG. 2.

A pixel defining layer 150 may be on the planarization layer 140. The pixel defining layer 150 includes openings corresponding respectively to sub-pixels, that is, at least an opening exposing a center portion of each pixel electrode 310, to define pixels. Also, in the example shown in FIG. 2, the pixel defining layer 150 increases a distance between an edge of the pixel electrode 310 and the opposite electrode 330 above the pixel electrode 310 so as to prevent an arc from generating (i.e. to prevent electrical shorts) at the edge of the pixel electrode 310. The pixel defining layer 150 may include an organic material, for example, PI or HMDSO.

The intermediate layer 320 of the organic light-emitting device may include low-molecular weight organic materials or polymer materials. When the intermediate layer 320 includes a low-molecular weight organic material, the intermediate layer 320 may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N,N'-diphenyl-benzidine (NPB), and tris-8-hydroxyquinoline aluminum (Alq$_3$). The low-molecular weight organic materials may be deposited by a vacuum deposition method.

When the intermediate layer 320 includes a polymer material, the intermediate layer 320 may include an HTL and an EML. Here, the HTL may include PEDOT, and the EML may include a poly-phenylenevinylene (PPV)-based or polyfluorene-based polymer material. The intermediate layer 320 above may be formed by a screen printing method, an inkjet printing method, or a laser induced thermal imaging (LITI) method.

However, the intermediate layer 320 is not limited to the above example, and may have various structures. In addition, the intermediate layer 320 may include a layer that is integrally formed across a plurality of pixel electrodes 310, or a layer that is patterned to separately correspond to each of the plurality of pixel electrodes 310.

The opposite electrode 330 is arranged above the intermediate layer 320 in the display area DA, and as shown in FIG. 2, may cover the display area DA. That is, the opposite electrode 330 may be integrally formed across a plurality of organic light-emitting devices, so as to correspond to a plurality of pixel electrodes 310.

Since the organic light-emitting device may be easily damaged by external moisture or oxygen, an encapsulation layer 400 may cover the organic light-emitting device to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 covers the opposite electrode 330, and may include silicon oxide, silicon nitride, and/or silicon oxynitride. If desired, other layers such as a capping layer may be formed between the first inorganic encapsulation layer 410 and the opposite electrode 330. Since the first inorganic encapsulation layer 410 is formed conformal to its underlying structures, the first inorganic encapsulation layer 410 may have an uneven upper surface as shown in FIG. 2. The organic encapsulation layer 420 covers the first inorganic encapsulation layer 410, and unlike the first inorganic encapsulation layer 410, the organic encapsulation layer 420 may have an even or planarized upper surface. In more detail, the organic encapsulation layer 420 may have a substantially even or planar upper surface at a portion corresponding to the display area DA. The organic encapsulation layer 420 may include at least one material selected from the group consisting of PET, PEN, PC, PI, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 outside the display area DA, in order not to expose the organic encapsulation layer 420 to external contaminants.

As described above, since the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be stopped at boundaries between the first inorganic encapsulation layer 410 and the organic encapsulation layer 420 or between the organic encapsulation layer 420 and the second inorganic encapsulation layer 430. As such, forming a path through which external moisture or oxygen may infiltrate into the display area DA may be prevented or reduced.

If necessary, a touch electrode having various patterns for executing a touchscreen function, or a touch protective layer for protecting the touch electrode, may be formed on the encapsulation layer 400. Such touch-related structures may be formed on the encapsulation layer 400 by a deposition process. One or more embodiments may not be limited thereto, that is, a touch panel prepared in advance and including a touch electrode may be attached to the encapsulation layer 400 so that the display apparatus may have the touch screen function.

A polarization plate 520 may be formed or positioned on the encapsulation layer 400 over an optically clear adhesive (OCA) 510. The polarization layer 520 may reduce reflection of external light. For example, when external light that passes through the polarization plate 520 is reflected by an upper surface of the opposite electrode 330 and then passes through the polarization plate 520 again, the external light passes through the polarization plate 520 twice and a phase of the external light may be changed. Therefore, a phase of reflected light is different from the phase of the external light entering the polarization plate 520 and thus destructive interference occurs. Accordingly, reflection of the external light may be reduced and visibility may be improved. The OCA 510 and the polarization plate 520 may cover an opening in the planarization layer 140, as shown in FIG. 2. The display apparatus according to one or more embodiments may omit the polarization plate 520, e.g. if desired, the polarization plate 520 may be omitted or replaced by other elements. For example, the polarization plate 520 may be omitted, and a black matrix and a color filter may instead be used to reduce reflection of external light.

In addition, the buffer layer 110, the gate insulating layer 120, and the interlayer insulating layer 130 including the inorganic material may be collectively referred to as an inorganic insulating layer. This inorganic insulating layer may include an opening corresponding to the bending area BA, as shown in FIG. 2. That is, the buffer layer 110, the gate insulating layer 120, and the interlayer insulating layer 130 may respectively include openings 110a, 120a, and 130a corresponding to the bending area BA, where these openings 110a, 120a, and 130a may collectively be referred to as an "opening". That the opening corresponds to the bending area BA may denote that the opening overlaps the bending area BA. Here, an area of the opening may be greater than that of the bending area BA. To do this, in FIG. 2, a width OW of the opening is greater than that of the bending area BA. Here, the area of the opening may be defined as the smallest area among areas of the openings 110a, 120a, and 130a of the buffer layer 110, the gate insulating layer 120, and the interlayer insulating layer 130. In addition, in FIG. 2, the area of the opening is defined by an area of the opening 110a in the buffer layer 110 (i.e. an area of the smallest of openings 110a, 120a, and 130a).

As shown in FIG. 2, an area of the opening 120a in the gate insulating layer 120 may be greater than that of the opening 110a in the buffer layer 110. However, one or more embodiments are not limited thereto, and an inner side surface of the opening 110a in the buffer layer 110 may correspond to an inner side surface of the opening 120a in the gate insulating layer 120 (see FIG. 17).

The display apparatus according to the embodiment includes an organic material layer 160 that fills at least partially the opening in the inorganic insulating layer. In FIG. 2, the organic material layer 160 completely fills the opening, i.e. covers the entire opening. In addition, the display apparatus according to the embodiment includes a conductive layer 215c that extends from the first area 1A to the second area 2A through the bending area BA, and is above the organic material layer 160. The conductive layer 215c may be on the inorganic insulating layer such as the interlayer insulating layer 130, if the organic material layer 160 is omitted. The conductive layer 215c may be formed simultaneously with the source electrode 215a or the drain electrode 215b, by using the same material as that of the source electrode 215a or the drain electrode 215b. If the touch electrode is on the encapsulation layer 400 as described above, the conductive layer 215c may be formed simultaneously with the touch electrode by using the same material as that of the touch electrode.

As described above, although FIG. 2 shows a state in which the display apparatus is not bent for convenience of description, the display apparatus according to the embodiment may actually be in a state in which the substrate 100 is bent at the bending area BA, as shown in FIG. 1. To do this, the display apparatus is manufactured so that the substrate 100 is flat, as shown in FIG. 2. After being manufactured, the substrate 100 is bent at the bending area BA so that the display apparatus may have the shape as shown in FIG. 1. Here, while the substrate 100 is bent at the bending area BA, tensile stress may be applied to the conductive layer 215c. Despite such stress, in the display apparatus according to the embodiment, the occurrence of defects in the conductive layer 215c during the bending process may be prevented or reduced.

If the inorganic insulating layer including the buffer layer 110, the gate insulating layer 120, and/or the interlayer insulating layer 130 does not include the opening corresponding to the bending area BA, but continuously extends from the first area 1A to the second area 2A, and if the conductive layer 215c is on such inorganic insulating layer, large tensile stress is applied to the conductive layer 215c during bending of the substrate 100. In particular, since the inorganic insulating layer has a greater hardness than that of the organic material layer, cracks are likely to form in the inorganic insulating layer in the bending area BA, and when a crack occurs in the inorganic insulating layer, the crack may also occur in the conductive layer 215c on the inorganic insulating layer and thus the probability of generating defects such as disconnection in the conductive layer 215c increases greatly.

However, according to the display apparatus of the embodiment, the inorganic insulating layer includes an opening corresponding to the bending area BA, and the part of the conductive layer 215c, which corresponds to the bending area BA, is on the organic material layer 160 that at least partially fills the opening of the inorganic insulating layer. Since the inorganic insulating layer has an opening corresponding to the bending area BA, the possibility of cracks occurring in the inorganic insulating layer is greatly reduced, and the organic material layer 160 is less likely to have cracks due to characteristics of the organic material. Therefore, the occurrence of cracks in the portion of the conductive layer 215c on the organic material layer 160 may be prevented or reduced, wherein the portion of the conductive layer 215c corresponds to the bending area BA. Since the organic material layer 160 has a lower hardness than that of an inorganic material layer, the organic material layer 160 may have lower tensile stress generated due to the bending of the substrate 100 so as to reduce the amount of tensile stress generated in the conductive layer 215c.

In addition, when the conductive layer 215c includes a plurality of through holes 215d (see FIG. 3) in at least a portion corresponding to the bending area BA, damage to the conductive layer 215c may be further prevented or reduced. Since the conductive layer 215c includes the plurality of through holes 215d, flexibility of the conductive layer 215c is improved, and accordingly, even when tensile stress occurs during the bending process, generation of defects such as disconnections in the conductive layer 215c may be effectively prevented. FIG. 2 does not show the plurality of through holes 215d in the conductive layer 215c, for convenience of description. Otherwise, it may be appreciated that FIG. 2 only shows a portion of the conductive layer 215c that does not contain through holes 215d.

The display apparatus according to the embodiment may further include additional conductive layers 213a and 213b, in addition to the conductive layer 215c. The additional conductive layers 213a and 213b may be in the first area 1A or the second area 2A so as to be located at a different layer level from that in which the conductive layer 215c is located, and may be electrically connected to the conductive layer 215c. In FIG. 2, the additional conductive layers 213a and 213b are shown to be located at the same layer level as the gate electrode 213 of the thin film transistor 210, that is, above the gate insulating layer 120, and formed by using the same material as that of the gate electrode 213. In addition, the conductive layer 215c contacts the additional conductive layers 213a and 213b via contact holes formed in the interlayer insulating layer 130. In addition, the additional conductive layer 213a is in the first area 1A, and the additional conductive layer 213b is in the second area 2A, as shown in FIG. 2.

The additional conductive layer 213a in the first area 1A may be electrically connected to the thin film transistor in the display area DA, and accordingly, the conductive layer 215c may be electrically connected to the thin film transistor in the display area DA via the additional conductive layer 213a. In addition, the additional conductive layer 213b in the second area 2A may be electrically connected to the thin film transistor in the display area DA via the conductive layer 215c. As described above, the additional conductive layers 213a and 213b may be outside the display area DA and electrically connected to elements in the display area DA, or may be outside the display area DA and extend toward the display area DA so as to be at least partially located in the display area DA.

As described above, in FIG. 2, the display apparatus is shown as being straight or unbent for convenience of description. However, in practice, the display apparatus according to the embodiment is actually in a state in which the substrate 100 is bent at the bending area BA, as shown in FIG. 1. To accomplish this, the display apparatus is first manufactured so that the substrate 100 is flat, as shown in FIG. 2. Subsequently, the substrate 100 is bent at the bending area BA so that the display apparatus may have the shape as shown in FIG. 1. Here, while the substrate 100 is bent at the bending area BA, tensile stress may be applied to elements located in the bending area BA.

Therefore, since the conductive layer 215c extending across the bending area BA includes a material having a high elongation rate, defects such as cracks or disconnections in the conductive layer 215c may be prevented. Moreover, the additional conductive layers 213a and 213b having a lower elongation rate than that of the conductive layer 215c and different physical properties from those of the conductive layer 215c are formed in the first area 1A and/or the second area 2A, and accordingly, an efficiency of transferring electric signals in the display apparatus may be improved or a defect rate during the manufacturing processes of the display apparatus may be reduced. For example, the additional conductive layers 213a and 213b may include molybdenum, and the conductive layer 215c may include aluminum. The conductive layer 215c or the additional conductive layers 213a and 213b may have a multi-layered structure, if desired.

Unlike the example shown in FIG. 2, the additional conductive layer 213b in the second area 2A may not be completely covered by the planarization layer 140, but may instead be at least partially exposed so as to be electrically connected to various electronic devices or printed circuit boards.

In addition, as shown in FIG. 2, it may be taken into account for the organic material layer 160 to cover an inner side surface of the opening in the inorganic insulating layer. As described above, the conductive layer 215c may be formed simultaneously with the source and drain electrodes 215a and 215b by using the same material as that of the source and drain electrodes 215a and 215b, and to do this, a conductive layer is formed above an entire surface of the substrate 100 and patterned to form the source electrode 215a, the drain electrode 215b, and the conductive layer 215c. If the organic material layer 160 does not cover the inner side surface of the opening 110a in the buffer layer 110, an inner side surface of the opening 120a in the gate insulating layer 120, or an inner side surface of the opening 130a in the interlayer insulating layer 130, a conductive material may not be removed, but may remain on the inner side surface of the opening 110a in the buffer layer 110, the opening 120a in the gate insulating layer 120, or the opening 130a in the interlayer insulating layer 130 while the conductive layer is patterned. In this case, the remaining conductive material may cause shorts among other conductive layers.

Therefore, the organic material layer 160 may cover the inner side surface of the opening in the inorganic insulating layer. In FIG. 2, the organic material layer 160 is shown to have a constant thickness, but may have a thickness that varies depending on location, so that an inclination of the curve in the upper surface of the organic material layer 160 may become slower or more gradual around the inner side surface of the opening 110a in the buffer layer 110, the inner side surface of the opening 120a in the gate insulating layer 120, or the inner side surface of the opening 130a in the interlayer insulating layer 130. Accordingly, undesired leftover portions of conductive material, which should have been removed, may be prevented during patterning of the source electrode 215a, the drain electrode 215b, and the conductive layer 215c.

As shown in FIG. 2, at least part of the upper surface (in the +z direction) of the organic material layer 160 may be an uneven surface 160a. Since the organic material layer 160 includes the uneven surface 160a, the conductive layer 215c on the organic material layer 160 may have an upper surface and/or a lower surface corresponding to the shape of the uneven surface 160a of the organic material layer 160.

As described above, since tensile stress may be applied to the conductive layer 215c when the substrate 100 is bent at the bending area BA during the manufacturing process, an amount of tensile stress applied to the conductive layer 215c may be reduced when the upper surface and/or the lower surface of the conductive layer 215c has a shape corresponding to the uneven surface 160a of the organic material layer 160. That is, the tensile stress generated during the bending process may be reduced through deformation of the low-strength organic material layer 160. More specifically, during bending, the uneven shape of the conductive layer 215c is deformed to correspond to the shape of the organic material layer 160 that is deformed due to the bending operation, so that generation of defects such as disconnections in the conductive layer 215c may be effectively prevented.

In addition, since the uneven surface 160a is present on at least part of the upper surface of the organic material layer 160 (in the +z direction), a surface area of the upper surface of the organic material layer 160 and a surface area of the upper and lower surfaces of the conductive layer 215c in the opening may be increased. Large surface areas of the upper surface of the organic material layer 160 and the upper and lower surfaces of the conductive layer 215c may denote that a deformation margin is large in order to reduce the tensile stress caused due to the bending of the substrate 100.

Since the conductive layer 215c is on the organic material layer 160, the lower surface of the conductive layer 215c has a shape corresponding to the uneven surface 160a of the organic material layer 160. However, the upper surface of the conductive layer 215c may have an uneven surface that has a shape different from the shape of the uneven surface 160a of the organic material layer 160.

For example, after forming a conductive material layer on the organic material layer 160, photoresist is applied to the conductive material layer and the photoresist is developed while varying an exposure amount according to locations on the photoresist, by using a slit mask or a half-tone mask. Accordingly, the conductive material layer exposed due to the developing of the photoresist is etched and then the photoresist is removed, and thus the conductive layer 215c is formed. Since the exposure amount varies according to the slit mask or the half-tone mask, a degree of etching the conductive material layer may vary depending on locations on the conductive material layer. Therefore, an uneven surface may be artificially formed in the upper surface of the conductive layer 215c, and in this case, the upper surface of the conductive layer 215c may have an uneven surface that has a shape independent of that of the uneven surface 160a of the organic material layer 160. This will be applied to one or more embodiments and modified examples thereof that will be described later. Even if the process of artificially forming the uneven surface in the upper surface of the conductive layer 215c is performed as described above, the uneven surface of the upper surface of the conductive layer 215c may correspond to the uneven surface 160a of the organic material layer 160.

The uneven surface 160a in the upper surface (in the +z direction) of the organic material layer 160 may be formed in various ways. For example, a photoresist material may be employed as described above, so that portions of the upper surface of organic material layer 160 are etched away. Here, the part that is etched more may form a depressed portion in the upper surface of the organic material layer 160. The method used when manufacturing the display apparatus according to the embodiment is not limited to the above example. For example, after forming the organic material layer 160 having a flat upper surface, certain portions may be removed by a dry etching method, or various other methods may be used.

In order for the organic material layer 160 to have the uneven surface 160a in the upper surface (in the +z direction) thereof, the organic material layer 160 may have a plurality of grooves in the upper surface (in the +z direction), wherein the grooves extend in the first direction (+y direction). Here, the upper surface of the conductive layer 215c above the organic material layer 160 has a shape corresponding to the upper surface of the organic material layer 160.

The uneven surface 160a of the organic material layer 160 may only be present within the opening of the inorganic insulating layer. In FIG. 2, a width UEW of the uneven surface 160a of the organic material layer 160 is less than a width OW of the opening of the inorganic insulating layer, so that the uneven surface 160a lies entirely within the opening in the inorganic insulating layer.

If the organic material layer 160 has the uneven surface 160a throughout the inside and outside of the opening in the inorganic insulating layer, the uneven surface 160a of the organic material layer 160 is near the internal surface of the opening 110a in the buffer layer 110, the internal surface of the opening 120a in the gate insulating layer 120, or the internal surface of the opening 130a in the interlayer insulating layer 130. In this case, the organic material layer 160 can have a relatively smaller thickness on depressed portions than that on protruding portions, and thus, when the depressed portions are located around the internal surface of the opening 110a in the buffer layer 110, the internal surface of the opening 120a in the gate insulating layer 120, or the internal surface of the opening 130a in the interlayer insulating layer 130, the organic material layer 160 may be disconnected. Therefore, the uneven surface 160a of the organic material layer 160 may be positioned entirely within the opening of the inorganic insulating layer, and thus, disconnection of the organic material layer 160 around the internal surface of the opening 110a in the buffer layer 110, the internal surface of the opening 120a of the gate insulating layer 120, or the internal surface of the opening 130a in the interlayer insulating layer 130 may be prevented.

As described above, in order not to generate disconnections in the conductive layer 215c at the bending area BA, the organic material layer 160 may have the uneven surface 160a over the bending area BA. Therefore, an area of the uneven surface 160a of the organic material layer 160 may be greater than that of the bending area BA and smaller than that of the opening. That is, as shown in FIG. 2, the width UEW of the uneven surface 160a of the organic material layer 160 is greater than the width of the bending area BA and less than the width OW of the opening.

In addition, a bending protection layer (BPL) 600 may be located outside the display area DA. That is, the BPL 600 may be located over the conductive layer 215c, corresponding at least to the bending area BA.

When a stack structure is bent, there is a stress neutral plane in the stack structure. If there is no BPL 600, when the substrate 100 is bent, excessive tensile stress may be applied to the conductive layer 215c in the bending area BA, because the location of the conductive layer 215c may not correspond to a stress neutral plane. However, by forming the BPL 600 and adjusting a thickness and a modulus of the BPL 600, a location of the stress neutral plane in a structure that includes the substrate 100, the conductive layer 215c, and the BPL 600 may be adjusted. In particular, the stress neutral plane may be adjusted to be around the conductive layer 215c via the BPL 600, and thus, the tensile stress applied to the conductive layer 215c may be reduced.

The BPL 600 may extend to an end of the substrate 100 in the display apparatus, unlike the example of FIG. 2. For example, in the second area 2A, the conductive layer 215c, the additional conductive layer 213b, and/or other conductive layers electrically connected to the conductive layer 215c and/or the additional conductive layer 213b may be at least partially exposed by openings in the interlayer insulating layer 130 or the planarization layer 140, and thus may be electrically connected to various electronic devices or printed circuit boards. Accordingly, the conductive layer 215c, the additional conductive layer 213b, and/or the other conductive layers electrically connected to the conductive layers 215c and 213b may have portions that are electrically connected to, for example, various electronic devices or printed circuit boards. Here, the electrically connected portions should preferably be protected against external impurities such as external moisture. Accordingly, the BPL 600 may cover the electrically connected portions so as to act as a protective layer as well. To do this, the BPL 600 may extend to, for example, the end of the substrate 100 of the display apparatus.

In addition, in FIG. 2, although the upper surface of the BPL 600 in a direction toward the display area DA (-x direction) coincides with the upper surface of the polarization plate 520 in the +z direction, one or more embodiments are not limited thereto. For example, the end of the BPL 600 in the display area DA direction (-x direction) may partially cover the upper surface of the end of the polarization plate 520. Alternatively, the end of the BPL 600 in the display area DA direction (-x direction) may not contact the polarization plate 520 and/or the OCA 510. In the latter case, during or after forming the BPL 600, diffusion of gas generated from the BPL 600 in a direction toward the display area DA (-x direction) may be prevented, thus preventing degradation of the display device 300.

As shown in FIG. 2, if the upper surface of the BPL 600 in a direction toward the display area DA (-x direction) coincides with the upper surface of the polarization plate 520 in the +z direction, if the end of the BPL 600 in the display area DA direction (-x direction) partially covers the upper surface at the end of the polarization plate 520, or if the end of the BPL 600 in the display area DA direction (-x direction) contacts the OCA 510, a height of the BPL 600 corresponding to the display area DA (-x direction) may be greater than that of the other portions of the BPL 600. Since a liquid phase material or a paste-type material may be applied and hardened to form the BPL 600, a volume of the BPL 600 may be reduced through the hardening process. Here, if a portion of the BPL 600 corresponding to the display area DA (-x direction) is in contact with the polarization plate 520 and/or the OCA 510, this portion of the BPL 600 is fixed at a certain minimum elevation, and thus, a volume reduction occurs in remaining portions of the BPL 600. Therefore, the height or elevation of the BPL 600 corresponding to the display area DA (-x direction) may be greater than that of the other portions of the BPL 600.

Figure 3:
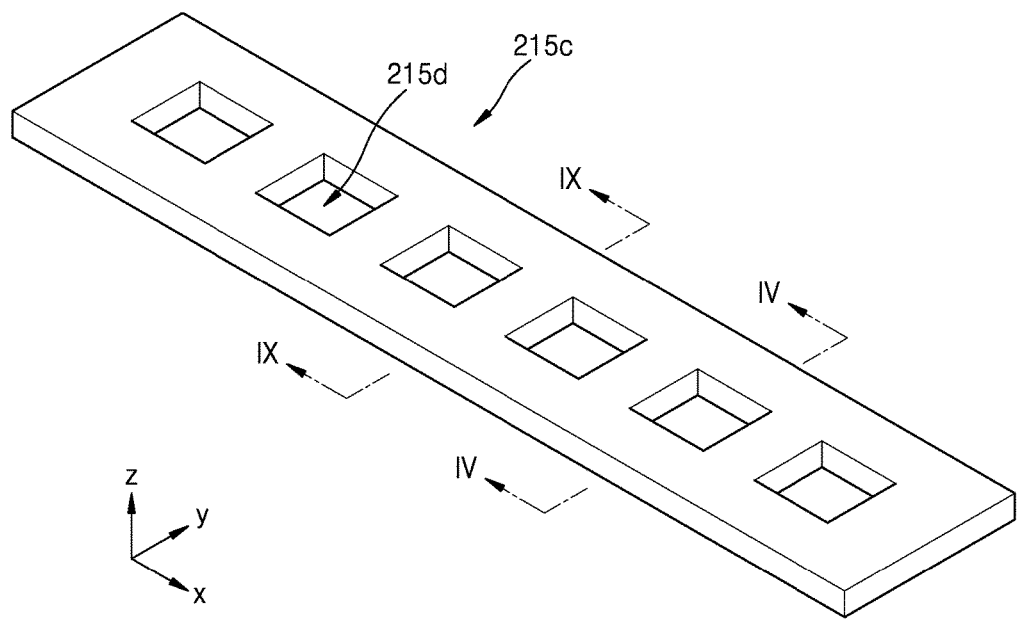
FIG. 3 is a schematic perspective view of a part of the display apparatus of FIG. 1.
Figure 4:
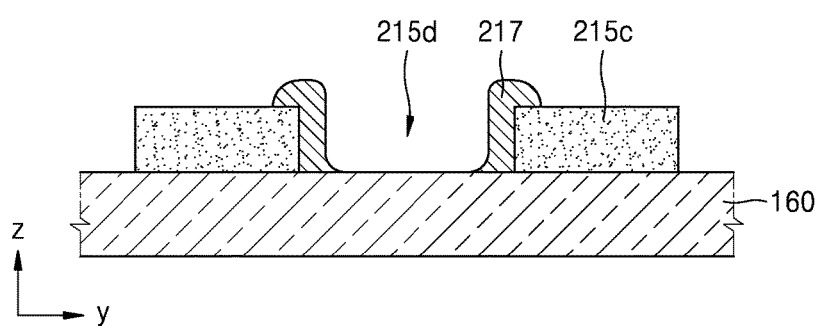
FIG. 4 is a schematic cross-sectional view of the display apparatus taken along line IV-IV of FIG. 3.

FIG. 3 is a schematic perspective view of a part of the display apparatus of FIG. 1, in particular, a part of the conductive layer 215a, and FIG. 4 is a schematic cross-sectional view of the conductive layer 215c taken along a line IV-IV of FIG. 3. As shown in FIG. 3, the conductive layer 215c may include a plurality of through holes 215d. Here, the display apparatus according to the embodiment further includes first protective layers 217 that are spaced apart from one another and at least partially cover internal side surfaces of the plurality of through holes 215d. In FIG. 4, the first protective layer 217 is shown to cover the entire internal side surface of the through hole 215d.

As described above, the conductive layer 215c is positioned above the organic material layer 160 in the bending area BA, and a layer including an organic material corresponding at least to the bending area BA is disposed on the conductive layer 215c. In FIG. 2, the planarization layer 140 including organic material is located on the conductive layer 215c. Unlike the example of FIG. 2, the organic material may be in other layers rather than the planarization layer 140, and these other layers may be on the conductive layer 215c. As described above, in the bending area BA, when layers including the organic material are both above and under the conductive layer 215c, the internal side surfaces of the plurality of through holes 215d in the conductive layer 215c may contact the organic material. In this case, the internal side surfaces of the plurality of through holes 215d in the conductive layer 215c and the organic material may react with each other, and thus, the internal side surfaces of the plurality of through holes 215d in the conductive layer 215c may be corroded. In this case, defects such as the disconnection of the conductive layer 215c may occur during or after manufacture of the display apparatus.

However, the display apparatus according to the embodiment includes first protective layers 217, which at least partially cover the internal side surfaces of the plurality of through holes 215d. As such, contacts between the internal side surfaces of the plurality of through holes 215d and the organic material may be prevented or reduced, and accordingly, corrosion of the internal side surfaces of the plurality of through holes 215d may be prevented or reduced. In addition, the plurality of first protective layers 217 are spaced apart from one another, allowing for bending of the substrate 100 at the bending area BA.

The first protective layers 217 prevent or reduce contacts between the internal side surfaces of the plurality of through holes 215d in the conductive layer 215c and the organic material, and thus, the first protective layers 217 include an inorganic material, not an organic material. For example, the first protective layers 217 may include silicon oxide, silicon nitride, or silicon oxynitride.

Figure 5:
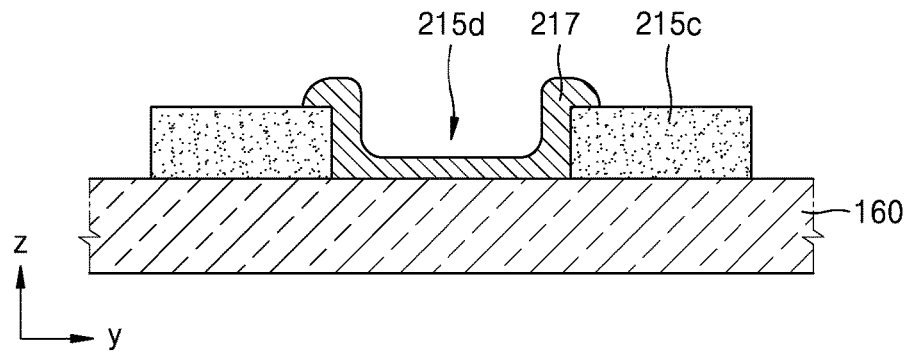
FIG. 5 is a schematic cross-sectional view of a part of a display apparatus according to an embodiment.

The first protective layers 217 may cover all the internal side surfaces of the plurality of through holes 215d in the conductive layer 215c, as shown in FIG. 4. Here, the first protective layers 217 may not cover a center portion of the bottom of through holes 215d, as shown in FIG. 4. Otherwise, as shown in FIG. 5 which is a schematic cross-sectional view of a part of a display apparatus according to an embodiment, the first protective layers 217 may cover all the exposed upper surface of the organic material layer 160 within the plurality of through holes 215d in the conductive layer 215c. This will be described in connection with other embodiments and examples thereof that will be described later.

Figure 6:
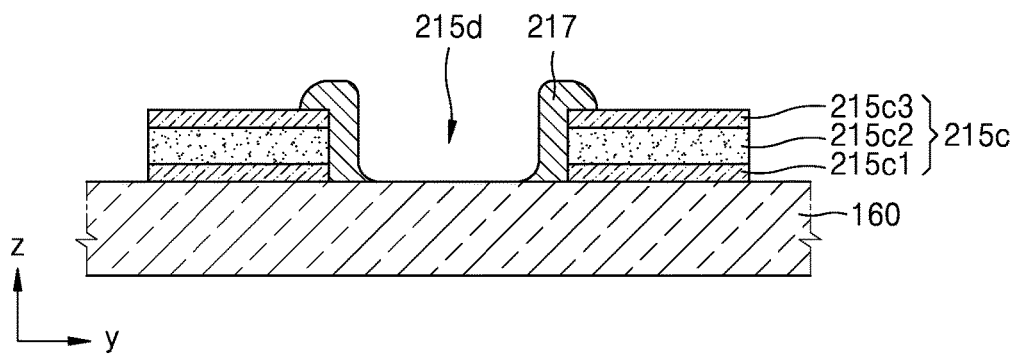
FIG. 6 is a schematic cross-sectional view of a part of a display apparatus according to an embodiment.

FIG. 6 is a schematic cross-sectional view of a part of a display apparatus according to an embodiment. As shown in FIG. 6, the conductive layer 215c may have a multi-layered structure. In FIG. 6, the conductive layer 215c is shown to include a first conductive layer 215c1, a second conductive layer 215c2, and a third conductive layer 215c3 that are sequentially stacked on the substrate 100. Here, a reactivity between the second conductive layer 215c2 and an organic material may be greater than that between the first conductive layer 215c1 and an organic material, or between the third conductive layer 215c3 and an organic material. For example, the first conductive layer 215c1 and the third conductive layer 215c3 may include titanium, and the second conductive layer 215c2 may include aluminum. In this case, the first protective layers 217 may cover an internal side surface of the second conductive layer 215c2 within the through holes 215d. As such, the second conductive layer 215c2, which has the largest reactivity with the organic material from among the first conductive layer 215c1, the second conductive layer 215c2, and the third conductive layer 215c3, does not directly contact the organic material. Thus, corrosion of the second conductive layer 215c2 may be reduced or prevented.

Figure 7:
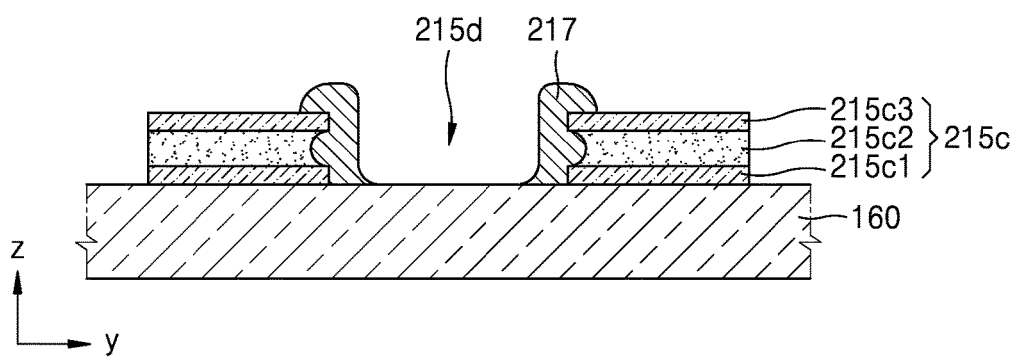
FIG. 7 is a schematic cross-sectional view of a part of a display apparatus according to an embodiment.

FIG. 7 is a schematic cross-sectional view of a part of a display apparatus according to an embodiment. As described above with reference to FIG. 6, the conductive layer 215c in the display apparatus according to the embodiment includes the first conductive layer 215c1, the second conductive layer 215c2, and the third conductive layer 215c3 that are sequentially stacked upon the substrate 100. Here, a second internal side surface of the second conductive layer 215c2 may be depressed in from a first internal side surface of the first conductive layer 215c1 and a third internal side surface of the third conductive layer 215c3, within through holes 215d.

When the conductive layer 215c is formed, a first conductive material layer, a second conductive material layer, and a third conductive material layer are sequentially deposited and patterned simultaneously to form the conductive layer 215c. During patterning of the first to third conductive material layers, an etching process is performed. At this time, if an etch rate of the second conductive material layer is greater than that of the first conductive material layer or that of the third conductive material layer, the second conductive material layer may be over etched. Thus, the second internal side surface of the second conductive layer 215c2 may be more concave than, and recessed in from, the first internal side surface of the first conductive layer 215c1 and the third internal side surface of the third conductive layer 215c3, as shown in FIG. 7. For example, when the first and third conductive layers 215c1 and 215c3 include titanium and the second conductive layer 215c2 includes aluminum, the internal side surfaces of the plurality of through holes 215d may each have the shape as shown in FIG. 7.

In the display apparatus according to the embodiment, the first protective layers 217 may each cover at least one of the first internal side surface of the first conductive layer 215c1 and the third internal side surface of the third conductive layer 215c3, and the second internal side surface of the second conductive layer 215c2. In FIG. 7, the first protective layers 217 cover each of the first internal side surface of the first conductive layer 215c1, the second internal side surface of the second conductive layer 215c2, and the third internal side surface of the third conductive layer 215c3. Here, in each of the first protective layers 217, a portion corresponding to the second internal side surface may have a greater thickness than that of a portion corresponding to at least one of the first internal side surface and the third internal side surface. This may be implemented by forming the first protective layer 217 such that the first protective layer 217 has a surface away from the first conductive layer 215c1 through the third conductive layer 215c3 and substantially perpendicular to the organic material layer 160 while filling the concave portion of the second internal side surface of the second conductive layer 215c2. As such, a contact area between the first protective layer 217 and the through hole 215d in the conductive layer 215c may be increased, and moreover, a volume of the first protective layer 217 may be increased. Thus, unintentional separation or isolation of the first protective layer 217 from the conductive layer 215c during manufacturing may be prevented. This will be further described in connection with other embodiments and modified examples thereof below.

Figure 8:
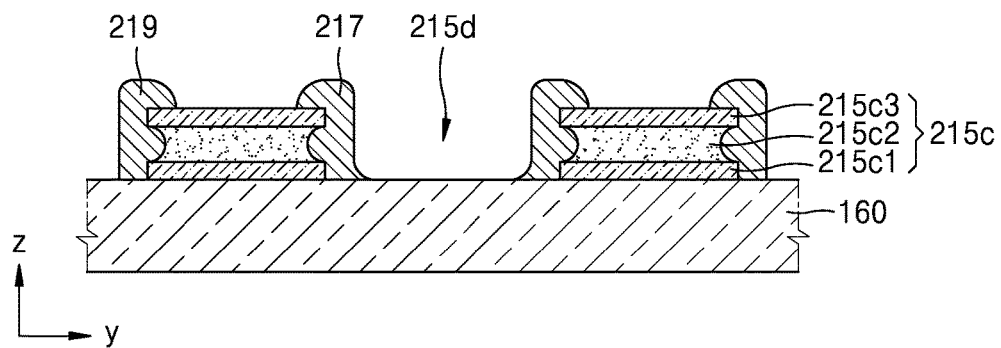
FIGS. 8 and 9 are schematic cross-sectional views of a part of a display apparatus according to an embodiment.
Figure 9:
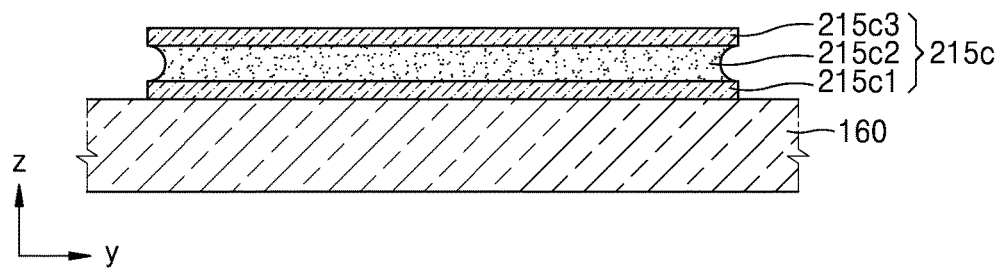

FIGS. 8 and 9 are schematic cross-sectional views of a part of a display apparatus according to an embodiment. More specifically, FIG. 8 is a schematic cross-sectional view of the display apparatus taken along in a line IV-IV of FIG. 3, and FIG. 9 is a schematic cross-sectional view of the display apparatus taken along a line IX-IX of FIG. 3. As described above, the conductive layer 215c may be corroded when the internal side surfaces of the plurality of through holes 215d contact the organic material layer. Moreover, opposite external surfaces of the conductive layer 215c in +y and −y directions contact the organic material as well, and thus, the conductive layer 215c may be corroded. Therefore, the display apparatus according to the embodiment may further include second protective layers 219 as shown in FIG. 8. The second protective layers 219 are spaced apart from one another corresponding to the bending area BA, and may partially cover the opposite external surfaces of the conductive layer 215c. The second protective layers 219 include an inorganic material such as silicon oxide, silicon nitride, or silicon oxynitride, and prevent direct contact between the opposite external surfaces of the conductive layer 215c and the organic material.

The second protective layers 219 are spaced apart from one another in a direction in which the conductive layer 215c extends (x-axis direction), and thus may at least partially cover side surfaces of the conductive layer 215c opposite to through holes 215d. Accordingly, as shown in FIG. 9, in the portion of the conductive layer 215c in which the plurality of through holes 215d are not located, the opposite external surfaces of the conductive layer 215c are not covered by the second protective layer 219.

In the display apparatus according to the embodiment, corrosion of the external surfaces of the conductive layer 215c, in which the through holes 215d are located, may be prevented or reduced. In addition, since the second protective layers 219 are spaced apart from one another in a direction in which the conductive layer 215c extends, they do not significantly increase the rigidity of substrate 100, and the substrate 100 may be sufficiently bent at the bending area BA. The external surface of the conductive layer 215c has a portion that is not covered by the second protective layers 219 and may be corroded. However, this portion of the conductive layer 215c does not include the through holes 215d referring to FIG. 3, and the conductive layer 215c at the corresponding portion may have a sufficiently large width. Thus, even if corrosion may occur, defects such as disconnections in the conductive layer 215c may not occur. This may be applied to the other embodiments and modified examples thereof that will be described later, unless it is contradictory thereto.

Figure 10:
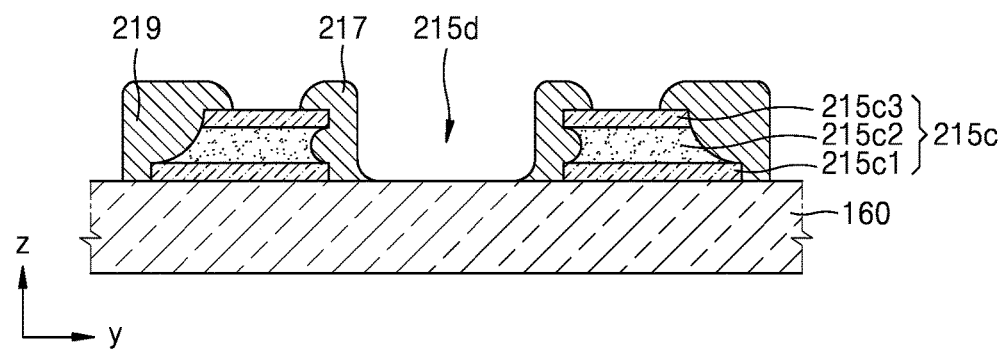
FIG. 10 is a schematic cross-sectional view of a part of a display apparatus according to an embodiment.

FIG. 10 is a schematic cross-sectional view of a part of a display apparatus according to an embodiment. FIG. 10 schematically shows a cross-section of the display apparatus taken along a line IV-IV of FIG. 3. The conductive layer 215c in the display apparatus according to the embodiment is wider close to the substrate 100 and narrows with distance therefrom, in the portion corresponding to the bending area BA. In particular, the conductive layer 215c includes the first conductive layer 215c1, the second conductive layer 215c2, and the third conductive layer 215c3 that are sequentially stacked on the substrate 100, and the first conductive layer 215c1 has a greater width than that of the third conductive layer 215c3 in the portion corresponding to the bending area BA.

The second protective layers 219 are spaced apart from one another in the direction in which the conductive layer 215c extends, and partially cover the opposite external surfaces of the conductive layer 215c. In particular, as shown in FIG. 10, in the portion of the conductive layer 215c in which the plurality of through holes 215d are formed, the second protective layers 219 may at least partially cover opposite external surfaces of the conductive layer 215c. As shown in FIG. 9, in the portion of the conductive layer 215c in which the plurality of through holes 215d are absent, the second protective layers 219 may not cover the opposite external surfaces of the conductive layer 215c.

In the display apparatus according to the embodiment, since the conductive layer 215c narrows with distance from the substrate 100, a contact area between the second protective layer 219 and the conductive layer 215c may be increased. Moreover, if necessary, a volume of the second protective layer 219 may be increased, in order to prevent the second protective layer 219 from unintentionally separating or isolating from the conductive layer 215c during manufacture. This will be further described in connection with the other embodiments and modified examples thereof below.

Figure 11:
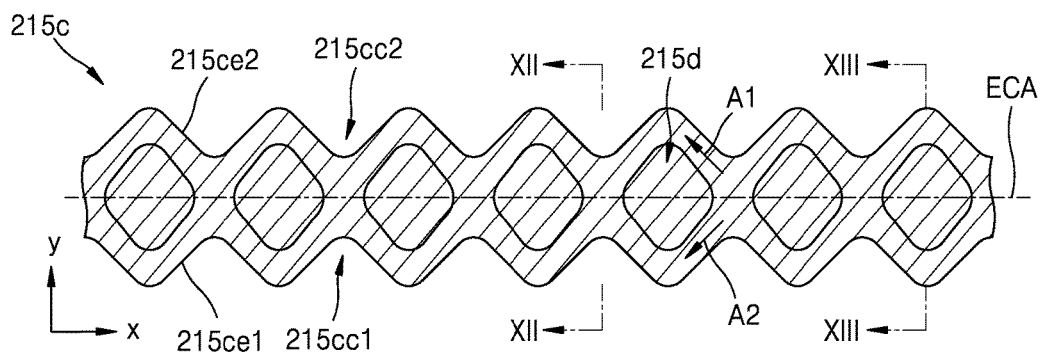
FIG. 11 is a schematic plan view of a part of a display apparatus according to an embodiment.
Figure 12:
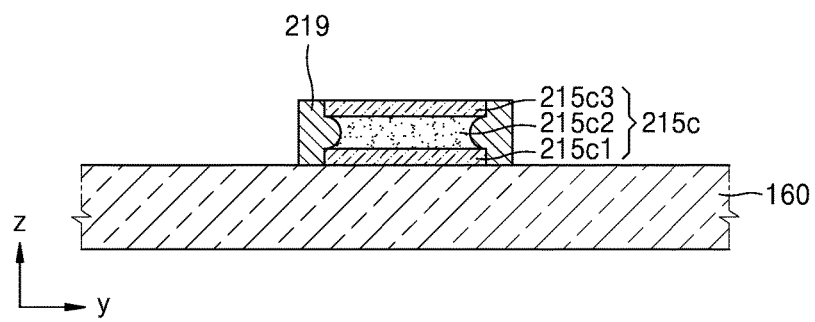
FIG. 12 is a schematic cross-sectional view of a part of the display apparatus taken along line XII-XII of FIG. 11.
Figure 13:
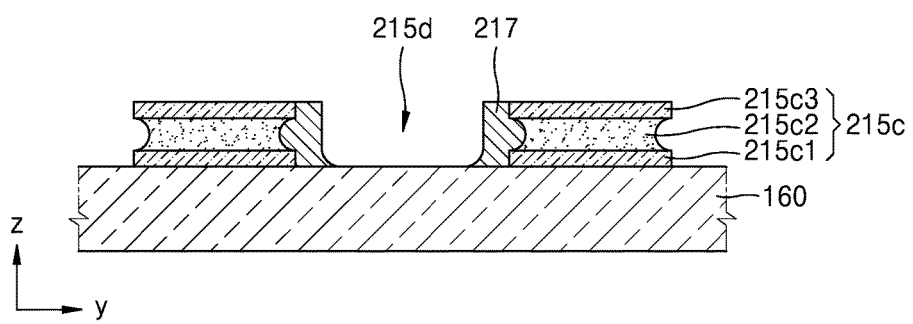
FIG. 13 is a schematic cross-sectional view of a part of the display apparatus taken along line XIII-XIII of FIG. 11.

FIG. 11 is a schematic plan view of the conductive layer 215c that is a part of a display apparatus according to an embodiment, FIG. 12 is a schematic cross-sectional view of the conductive layer 215c taken along a line XII-XII of FIG. 11, and FIG. 13 is a schematic cross-sectional view of the conductive layer 215c taken along a line XIII-XIII of FIG. 11.

In the display apparatus according to the embodiment, the plurality of through holes 215d in the conductive layer 215c are arranged in a row along a direction in which the conductive layer 215c extends. In addition, a first edge 215ce1 of the conductive layer 215c, which is at one side of an extending center axis ECA of the conductive layer 215c (−y direction), includes first concave portions 215cc1 that correspond to spaces between the plurality of through holes 215d. In addition, a second edge 215ce2 of the conductive layer 215c, which is at the other side of the extending center axis ECA (+y direction), includes second concave portions 215cc2 corresponding to the spaces between the plurality of through holes 215d. In particular, the first concave portions 215cc1 and the second concave portions 215cc2 may be in one-to-one correspondence, as shown in FIG. 11.

In the display apparatus according to the embodiment, obliquely angled edges of the through holes 215d with respect to the direction of extending center axis ECA, are denoted by an arrow A1 and an arrow A2 in FIG. 11. The bending axis BAX (see FIG. 1) when the substrate 100 is bent at the bending area BA is nearly perpendicular to the extending center axis ECA of the conductive layer 215c. Accordingly, bending may result in reduction of the angles of arrows A1 and A2 with respect to axis ECA, rather than tension or elongation. Therefore, tensile stress in layer conductive 215c is reduced during bending, and generation of crack or disconnection in the conductive layer 215c may be prevented or reduced.

Here, as shown in FIG. 12, the second protective layers 219 are spaced apart from one another in the direction in which the conductive layer 215c extends (x-axis direction), and cover external surfaces of the first concave portions 215cc1 and external surfaces of the second concave portions 215cc2 of the conductive layer 215c. The second protective layers 219 are spaced apart from one another in the direction in which the conductive layers 215c extends (x-axis direction), and thus, the external surfaces of the conductive layer 215c, which correspond to centers of the through holes 215d, may not be covered by the second protective layers 219, as shown in FIG. 13.

As shown in FIG. 11, since the conductive layer 215c includes the first concave portions 215cc1 and the second concave portions 215cc2, the conductive layer 215c is narrower where the first and second concave portions 215cc1 and 215cc2 are formed. Therefore, if the external surface of the conductive layer 215c corresponding to the concave portions 215cc1 and 215cc2 is corroded, defects such as disconnections in the conductive layer 215c may occur. However, in the display apparatus according to the embodiment, the second protective layers 219 cover the external surfaces of the first and second concave portions 215cc1 and 215cc2 in the conductive layer 215c. Thus, corrosion on the external surfaces of the corresponding portions in the conductive layer 215c may be prevented or reduced.

If the surfaces of the through holes 215d are not covered by the second protective layers 219, corrosion may occur. However, as shown in FIG. 11, it may be understood that the portions corresponding to the centers of the through holes 215d in the conductive layer 215c each have two conductive paths, and thus, even if one of the two paths is damaged due to corrosion, the other path may be still act as a conductive path, thereby reducing a defect rate.

Figure 14:
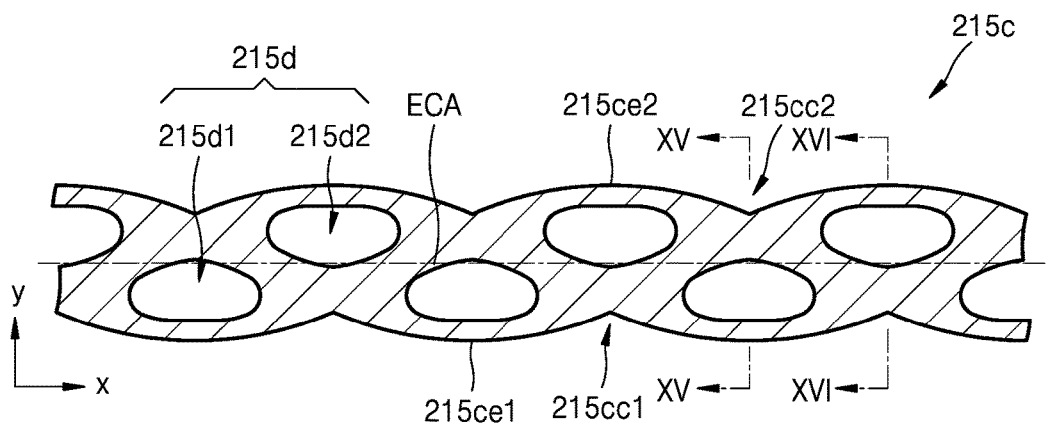
FIG. 14 is a schematic plan view of a part of a display apparatus according to an embodiment.
Figure 15:
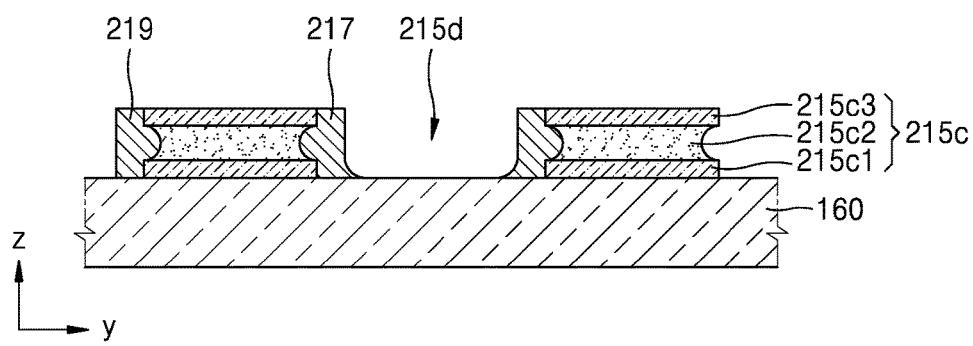
FIG. 15 is a schematic cross-sectional view of a part of the display apparatus taken along line XV-XV of FIG. 14.
Figure 16:
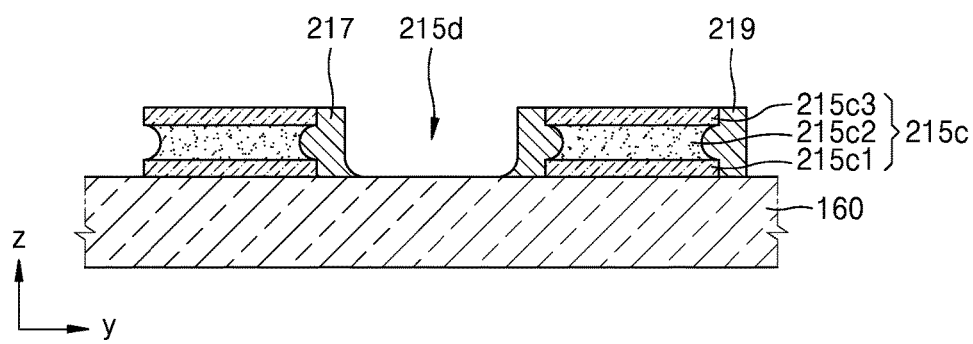
FIG. 16 is a schematic cross-sectional view of a part of the display apparatus taken along line XVI-XVI of FIG. 14.

FIG. 14 is a schematic plan view of a part of a display apparatus according to an embodiment, FIG. 15 is a schematic cross-sectional view of the conductive layer taken along a line XV-XV of FIG. 14, and FIG. 16 is a schematic cross-sectional view of the conductive layer 215c taken along a line XVI-XVI of FIG. 14.

As shown in FIG. 14, in the conductive layer 215c in the display apparatus according to the embodiment, multiple through holes 215d are arranged along a direction in which the conductive layer 215c extends (+x direction). The through holes 215d may include a plurality of first through holes 215d1 having centers positioned at a side of the extending center axis ECA (−y direction), and a plurality of second through holes 215d2 having centers positioned at the other side of the extending center axis ECA (+y direction). Here, the plurality of first through holes 215d1 and the plurality of second through holes 215d2 are alternately located along the extending direction of the conductive layer 215c (+x direction). In addition, a first edge 215ce1 of the conductive layer 215c at a side of the extending center axis ECA (−y direction) includes first concave portions 215cc1 corresponding to the plurality of second through holes 215d2, and a second edge 215ce2 of the conductive layer 215c at the other side of the extending center axis ECA (+y direction) includes second concave portions 215cc2 corresponding to the plurality of first through holes 215d1.

Here, the second protective layers 219 cover external or outer surfaces of the first edge 215ce1 of the conductive layer 215c, wherein the external surfaces are between the first concave portions 215cc1 as shown in FIG. 15. The second protective layers 219 may also cover external surfaces of the second edge 215ce2 of the conductive layer 215c, wherein the external surfaces are between the second concave portions 215cc2 as shown in FIG. 16. In short, the second protective layers 219 may cover parts of the external surfaces of the first edge 215ce1 that correspond to the first through holes 215d1, and may also cover parts of the external surfaces of the second edge 215ce2 that correspond to the second through holes 215d2.

As shown in FIG. 14, since the first through holes 215d1 and the second through holes 215d2 are arranged alternately with each other and the conductive layer 215c includes the first concave portions 215cc1 and the second concave portions 215cc2, the portions of the first edge 215ce1 between the first concave portions 215cc1, that is, the portions of the first edge 215ce1 corresponding to the first through holes 215d1, may provide a conductive path having a reduced width. Likewise, the portions of the second edge 215ce2 between the second concave portions 215cc2, that is, the portions of the second edge 215ce2 corresponding to the second through holes 215d2, may also provide a conductive path having a reduced width. Therefore, a possibility of generating disconnection in the conductive paths in the above portions increases when corrosion occurs on the above portions, and thus, the second protective layers 219 cover the above portions to prevent or reduce the generation of defects.

If the external surfaces of the first edge 215ce1 between the first through holes 215d1 or the external surfaces of the second edge 215ce2 between the second through holes 215d2 are not covered by the second protective layers 219, corrosion may occur. However, as shown in FIG. 14, the above portions have conductive paths that are greater in width, and thus, the defect rate may be decreased.

In the above described embodiments, the plurality of through holes 215d have roughly square cross-sectional shapes, but they are not limited thereto. For example, the plurality of through holes 215d may have various other cross-sectional shapes, e.g., circles, rhombuses, chamfered squares, chamfered rhombuses, ovals, or dented circles.

In addition, in the cross-sectional views of FIGS. 12, 13, 15, and 16, the first protective layers 217 or the second protective layers 219 are shown not to cover the upper surface of the conductive layer 215c, but embodiments of the invention are not limited thereto. That is, as shown in FIGS. 4 to 8, and 10, the first protective layers 217 or the second protective layers 219 may partially cover the upper surface of the conductive layer 215c. For example, the first protective layers 217 may cover parts of the upper surface of the conductive layer 215c that are adjacent to the through holes 215d. The second protective layers 219 may also cover any other parts of the upper surface of the conductive layer 215c, e.g., portions adjacent to the edges. Thus, in many embodiments, at least the internal side surfaces of the plurality of through holes 215d in the conductive layer 215c may be covered by the first protective layers 217.

Figure 17:
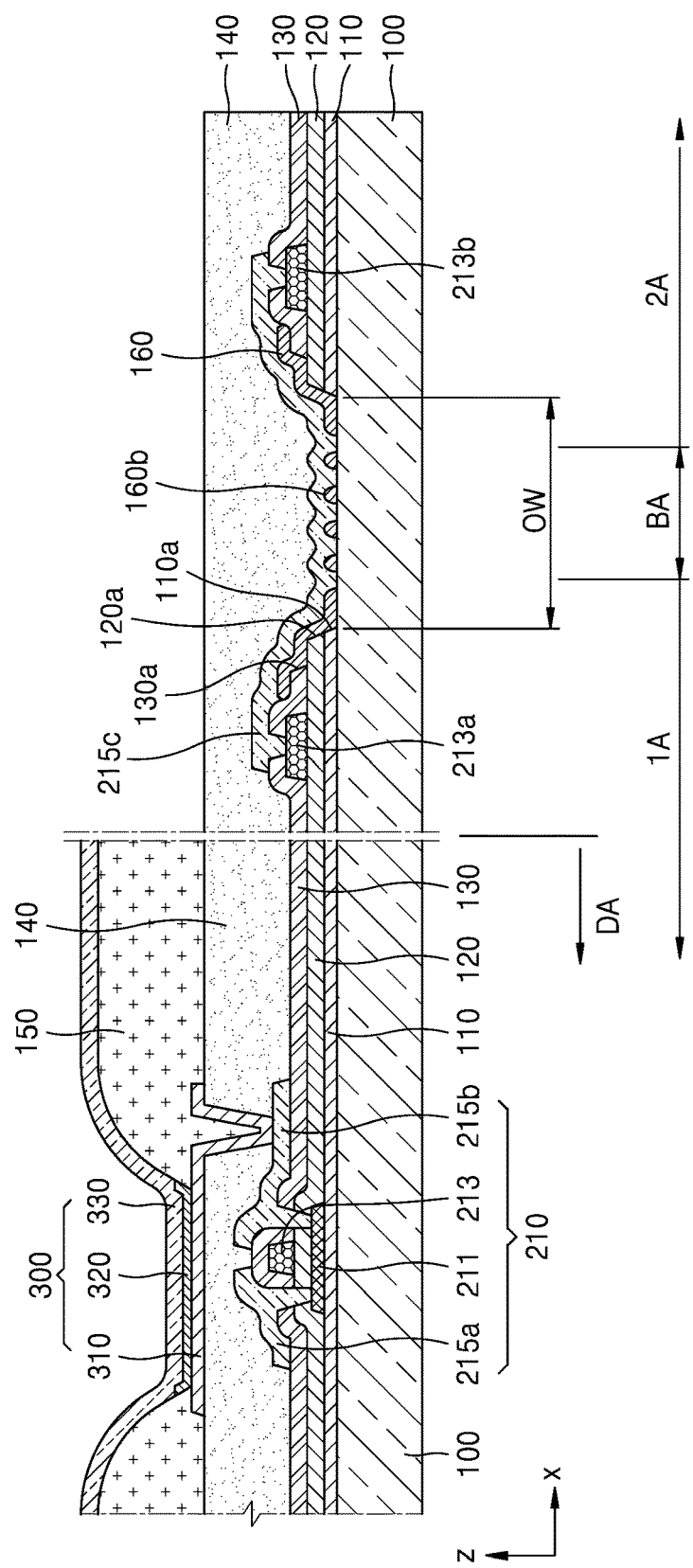
FIG. 17 is a schematic cross-sectional view of a part of a display apparatus according to an embodiment.

FIG. 17 is a schematic cross-sectional view of a part of a display apparatus according to an embodiment. The display apparatus according to the embodiment is different from the display apparatus described above with reference to FIG. 2 in that the organic material layer 160 is not formed integrally with, or continually across, the bending area BA, but instead includes a plurality of islands 160b that fill at least partially the opening in the inorganic insulating layer and are spaced apart from one another. The plurality of islands 160b extend in the first direction (+y direction), that is, in a direction of the bending axis BAX, and are spaced apart from one another in the second direction (+x direction) that crosses the bending axis.

A conductive layer 215c covers the plurality of islands 160b, and accordingly, an upper surface of the conductive layer 215c above the plurality of islands 160b has a shape corresponding to upper surfaces of the plurality of islands 160b. Thus, a surface area of the upper surface of the conductive layer 215c (in the +z direction) may be greater than if the upper surface was flat. In this above structure, when the first protective layers 217 and/or the second protective layers 219 are present, corrosion on the conductive layer 215c may be prevented or reduced. The structures of the conductive layers in the above described embodiments may be also applied to the conductive layer 215c of FIG. 17.

In addition, a case where the inorganic insulating layer includes the opening is described above, but one or more embodiments are not limited thereto. More specifically, the inorganic insulating layer may include openings of various shapes, such as a groove. For example, in the structure shown in FIG. 2 or FIG. 17, the buffer layer 110 may not include the opening, but may instead be continuously formed throughout the first area 1A, the bending area BA, and the second area 2A. Similarly, the gate insulating layer 120 and the interlayer insulating layer 130 may only have the openings 120a and 130a. In this case, when the buffer layer 110, the gate insulating layer 120, and the interlayer insulating layer 130 are collectively referred to as the inorganic insulating layer, it may be understood that the inorganic insulating layer includes a groove, not an opening, corresponding to the bending area BA. The opening 120a of the gate insulating layer 120 and the opening 130a of the interlayer insulating layer 130 may be formed through one patterning process. For example, when contact holes are formed in the gate insulating layer 120 and the interlayer insulating layer 130 so that the source electrode 215a and the drain electrode 215b of the thin film transistor 210 may contact the semiconductor layer 211, the openings 120a and 130a may be formed at the same time. In this case, the internal side surface of the opening 120a in the gate insulating layer 120 may correspond to the internal side surface of the opening 130a in the interlayer insulating layer 130. That is, the internal surfaces of the opening 120a in the gate insulating layer 120 and of the opening 130a in the interlayer insulating layer 130 may overlap to form a continuous surface.

In this case, the organic material layer 160 in the above described embodiments may be understood to at least partially fill the groove in the inorganic insulating layer. That is, the uneven surface 160a of the organic material layer 160 may be above the buffer layer 110 in the bending area BA, or the plurality of islands 160b may be above the buffer layer 110 in the bending area BA. The structures of the conductive layer 215c, the first protective layers 217, and/or the second protective layers 219 as described above may be applied to this embodiment as well as others.

Figure 18:
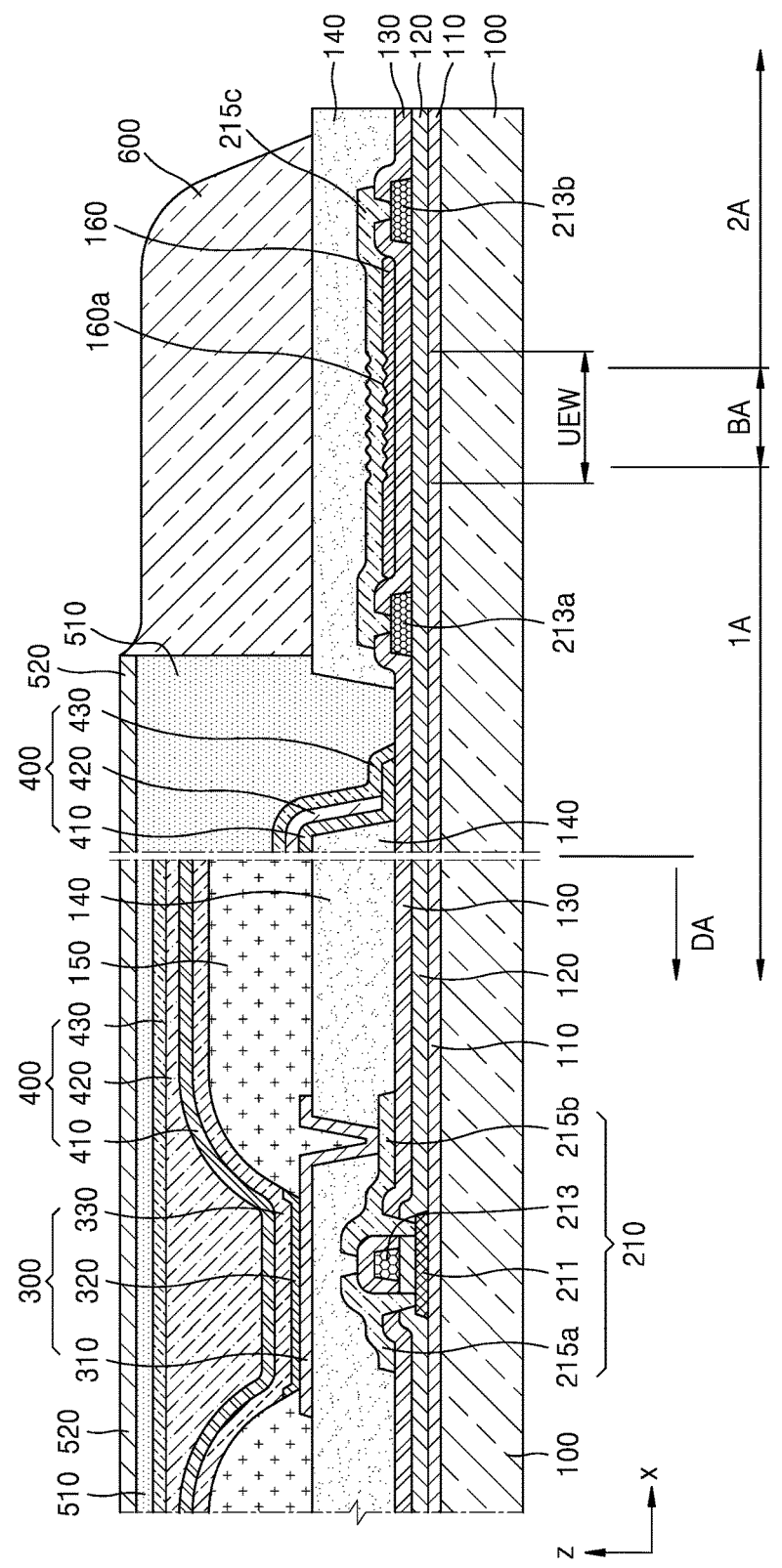
FIG. 18 is a schematic cross-sectional view of a part of a display apparatus according to an embodiment.

Moreover, a case in which the inorganic insulating layer includes neither an opening nor a groove may be also included in the scope of the inventive concept. For example, unlike the embodiment illustrated in FIG. 2, the buffer layer 110, the gate insulating layer 120, and the interlayer insulating layer 130 may be continuous throughout the first area 1A, the bending area BA, and the second area 2A, as shown in FIG. 18. In addition, the organic material layer 160 is above the substrate 100, e.g., the interlayer insulating layer 130, and may have the uneven surface 160a in the upper surface thereof corresponding at least to the bending area BA, if desired. The uneven surface 160a may be understood to have a plurality of protrusions. In this case, the structures of the conductive layer 215c, the first protective layers 217, and/or the second protective layers 219 as described above may be applied.

Also, unlike the example illustrated with reference to FIG. 17, the buffer layer 110, the gate insulating layer 120, and the interlayer insulating layer 130 may be continuous throughout the first area 1A, the bending area BA, and the second area 2A, and the plurality of islands 160b corresponding at least to the bending area BA and spaced apart from one another may be above the substrate 100, e.g., where the uneven surface 160a is located in the example of FIG. 18. In this case, the structures of the conductive layer 215c, the first protective layers 217, and/or the second protective layers 219 as described above may be applied.

Figure 19:
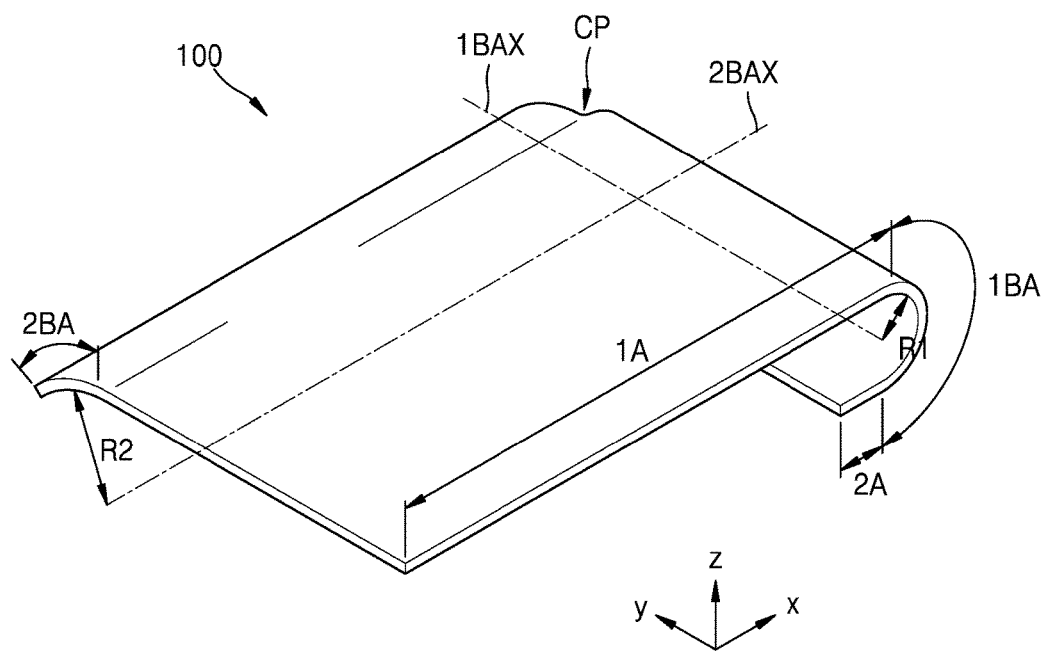
FIG. 19 is a schematic perspective view of a part of a display apparatus according to an embodiment.

FIG. 19 is a schematic perspective view of a part of a display apparatus according to an embodiment, in detail, the substrate 100. The bending area BA described with reference to the above embodiments is shown as a first bending area 1BA in FIG. 19, and the substrate 100 is bent about a first bending axis 1BAX at the first bending area 1BA.

Unlike the example illustrated with reference to FIG. 1, the display apparatus according to the embodiment further includes a second bending area 2BA, in addition to the first bending area 1BA. The second bending area 2BA is within the first area 1A. Like the substrate 100 bent at the first bending area 1BA about the first bending axis 1BAX extending in the first direction (+y direction), the substrate 100 is also bent about a second bending axis 2BAX extending in the second direction (+x direction). Here, a corner of the substrate 100 is chamfered, wherein the corner is closest to a portion where the first bending axis 1BAX and the second bending axis 2BAX cross each other, so that this corner of substrate 100 has a chamfered portion CP. Since the chamfered portion CP exists, the substrate 100 may be bent about the second bending axis 2BAX, as well as about the first bending axis 1BAX.

Here, a radius of curvature R1 of the substrate 100 at the first bending area 1BA is less than a radius of curvature R2 of the substrate 100 at the second bending area 2BA. This may be understood that the substrate 100 is bent more gently at the second bending area 2BA, than at the first bending area 1BA. Therefore, in the second bending area 2BA, tensile stress applied to the components of the display apparatus is relatively less than that applied to the components in the first bending area 1BA. Therefore, the inorganic insulating layer described above with reference to the above embodiments may be continuous in at least a part including the second bending area 2BA. Here, the reason why the inorganic insulating layer has to be continuous in at least a part is that the inorganic insulating layer may have contact holes for electrically connecting upper and lower conductive layers within the first area 1A. The contact holes are shown as circles, ovals, squares, or similar shapes thereof in a plan view, and the openings or the grooves may be shown as a rectangle having a very large aspect ratio in a plan view. If desired, the inorganic insulating layer may have openings or grooves also in the second bending area 2BA. In addition, the organic material layer 160 and the conductive layer 215c described above may be within the second bending area 2BA.

Figure 20:
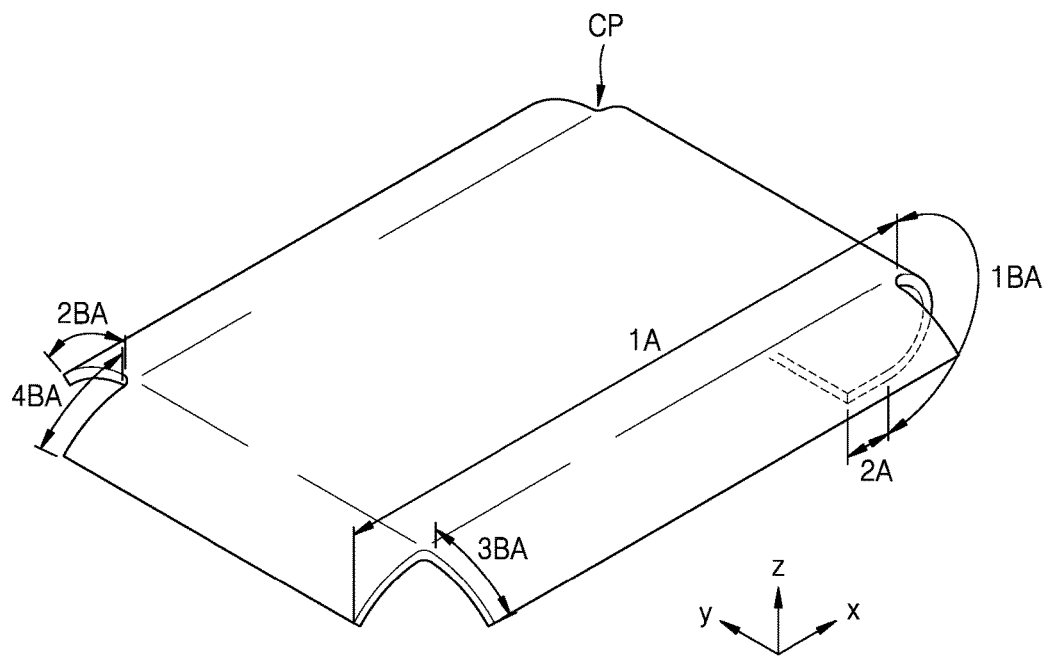
FIG. 20 is a schematic perspective view of a part of a display apparatus according to an embodiment.

FIG. 19 shows that the display apparatus includes the second bending area 2BA, in addition to the first bending area 1BA, but one or more embodiments are not limited thereto. For example, as shown in FIG. 20 which is a schematic perspective view of a part of a display apparatus according to an embodiment, the display apparatus may further include a third bending area 3BA and a fourth bending area 4BA, in addition to the first bending area 1BA and the second bending area 2BA. In this embodiment, it may be understood that four edges of the display apparatus are all bent. Here, the third bending area 3BA and the fourth bending area 4BA may have a structure that is similar to or the same as that of the second bending area 2BA.

In the display apparatus of this embodiment, the display apparatus may be bent at the second bending area 2BA through the fourth bending area 4BA, and thus, when a user watches a display screen of the display apparatus, the user may perceive that the part of the peripheral area that does not perform the display operation and includes pads has been reduced. Unlike the example illustrated in FIG. 20, the substrate 100 may alternatively be bent at one or more radii of curvature that are the same as or similar to that of the first bending area 1BA.

Figure 21:
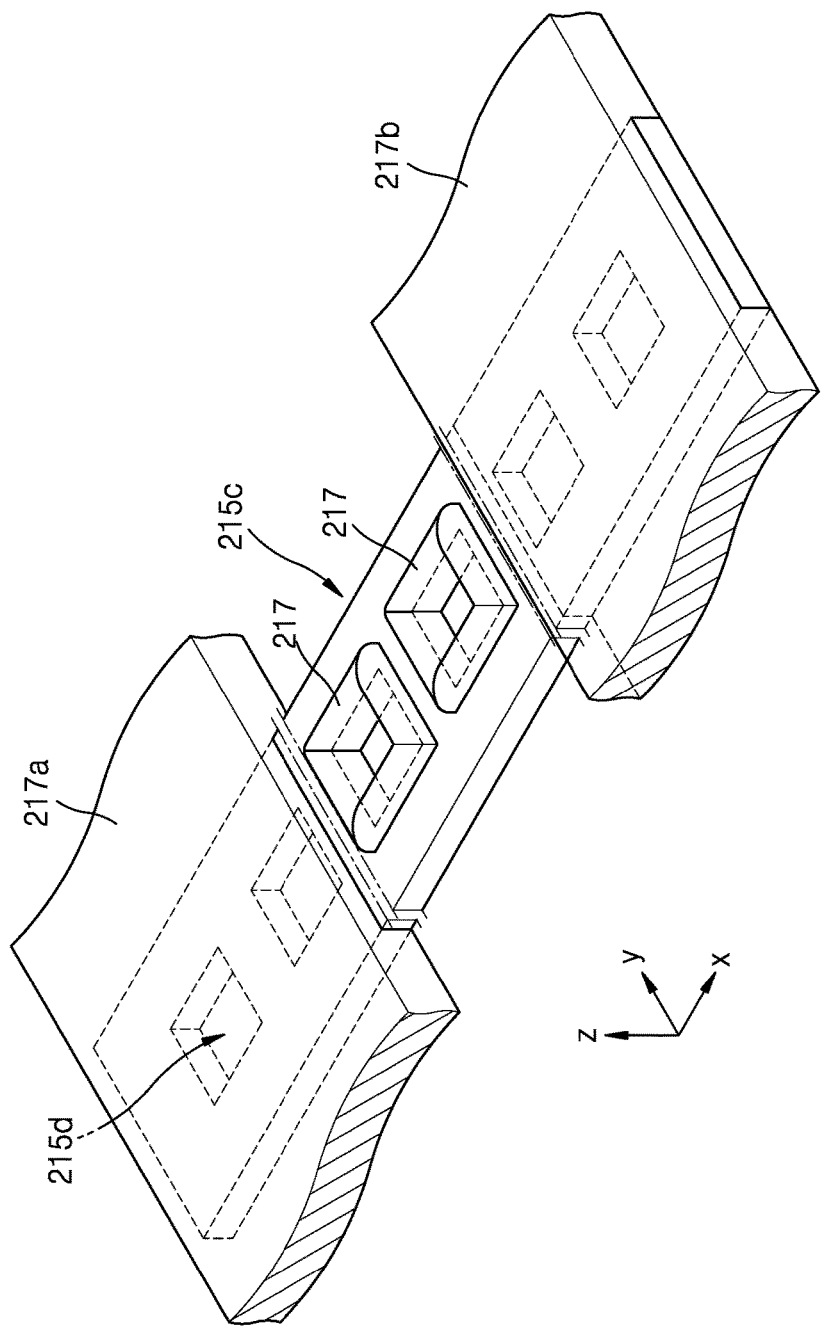
FIG. 21 is a schematic perspective view of a part of a display apparatus according to an embodiment.

FIG. 21 is a schematic perspective view of a part of a display apparatus according to an embodiment. As shown in FIG. 21, when the conductive layer 215c includes the plurality of through holes 215d in the bending area BA, the first protective layers 217 spaced apart from each other may at least partially cover the internal side surfaces of the through holes 215d at the center of the bending area BA. In addition, additional protective layers 217a and 217b are provided on portions other than the center of the bending area BA, that is, a portion adjacent to the first area 1A or a portion adjacent to the second area 2A, and the additional protective layers 217a and 217b that are not patterned may cover the conductive layer 215c. Such additional protective layers 217a and 217b may include an inorganic material such as silicon oxide, silicon nitride, or silicon oxynitride. In such a configuration, large stresses in the additional protective layers 217a and 217b may be avoided, and thus cracks may not occur even when the substrate 100 is bent, because the additional protective layers 217a and 217b are not provided at the center of the bending area BA.

According to one or more embodiments, a display apparatus is capable of reducing generation of defects such as disconnections during manufacture, while ensuring longer lifespan of the display apparatus. However, the scope of the one or more embodiments is not limited to the above effect.

It should be understood that embodiments described herein should be considered in a descriptive sense only and not for purposes of limitation. Descriptions of features or aspects within each embodiment should typically be considered as available for other similar features or aspects in other embodiments. For example, it is described that the substrate is bent in the bending area in aforementioned embodiments. However, the present invention is not limited hereto and the substrate may be bendable in the bending area.

While one or more embodiments have been described with reference to the figures, it will be understood by those of ordinary skill in the art that various changes in form and details may be made therein without departing from the spirit and scope as defined by the following claims. Various features of the above described and other embodiments can thus be mixed and matched in any manner, to produce further embodiments consistent with the invention.

What is claimed is:

1. A display apparatus comprising:
    a substrate comprising a bending area between a first area and a second area, the bending area of the substrate being bent or bendable about a bending axis, wherein a first boundary exists between the first area and the bending area, and wherein a second boundary exists between the bending area and the second area;
    an organic material layer positioned on the substrate corresponding at least to the bending area, wherein the first boundary and the second boundary are positioned between a first end of the organic material layer and a second end of the organic material layer;
    a conductive layer extending from the first area to the second area through the bending area, positioned over the organic material layer, and comprising a plurality of through holes positioned corresponding to the bending area, wherein the first end of the organic material layer is positioned between a first end of the conductive layer and the first boundary, and wherein the second end of the organic material layer is positioned between a second end of the conductive layer and the second boundary; and
    first protective layers spaced apart from one another and at least partially covering sides of the plurality of through holes.

2. The display apparatus of claim 1, wherein the first protective layers comprise an inorganic material.

3. The display apparatus of claim 1, wherein the first protective layers substantially completely cover the sides of the plurality of through holes.

4. The display apparatus of claim 1, wherein the first protective layers cover the sides of the plurality of through holes and an upper surface of the organic material layer, wherein the upper surface is exposed via the plurality of through holes.

5. The display apparatus of claim 1, wherein the organic layer comprises a recess, and wherein a portion of the conductive layer is positioned inside the recess, overlaps the bending area, and comprises the plurality of through holes.

6. The display apparatus of claim 1, wherein the conductive layer has a multi-layered structure.

7. The display apparatus of claim 6, wherein the conductive layer comprises a first conductive layer, a second conductive layer, and a third conductive layer that are sequentially stacked, a reactivity of the second conductive layer with an organic material is greater than a reactivity of the first conductive layer with an organic material and a reactivity of the third conductive layer with an organic material, and the first protective layers at least cover portions of the sides corresponding to the second conductive layer.

8. The display apparatus of claim 6, wherein: the conductive layer comprises a first conductive layer, a second conductive layer, and a third conductive layer, and within the through holes, surfaces of the second conductive layer are recessed away from surfaces of the first conductive layer and the third conductive layer.

9. The display apparatus of claim 8, wherein the first protective layers cover the surfaces of the second conductive layer and at least one of the first and third conductive layers, and a portion of the first protective layers that covers the surface of the second conductive layer is greater in thickness than a portion of the first protective layers that covers the surface of the at least one of the first and third conductive layers.

10. The display apparatus of claim 1, further comprising second protective layers that are spaced apart from each other in the bending area so as to partially cover opposing outer surfaces of the conductive layer.

11. The display apparatus of claim 10, wherein the second protective layers comprise an inorganic material.

12. The display apparatus of claim 10, wherein a portion of the conductive layer that corresponds to the bending area has a lower surface and an upper surface, and wherein a width of the lower surface is greater than a width of the upper surface.

13. The display apparatus of claim 10, wherein: the conductive layer comprises a first conductive layer, a second conductive layer, and a third conductive layer that are stacked in order of increasing distance from the substrate, and in a portion corresponding to the bending area, the first conductive layer has a width that is greater than a width of the third conductive layer.

14. The display apparatus of claim 13, wherein the second protective layers at least partially cover opposing outer surfaces of the second conductive layer.

15. The display apparatus of claim 10, wherein the through holes are arranged in a row along a direction in which the conductive layer extends.

16. The display apparatus of claim 15, wherein a first edge of the conductive layer comprises first concave portions positioned between adjacent through holes, and a second edge of the conductive layer comprises second concave portions positioned between adjacent through holes.

17. The display apparatus of claim 16, wherein the second protective layers cover the first concave portions and the second concave portions.

18. The display apparatus of claim 10, wherein the through holes are arranged along a direction in which the conductive layer extends, and comprise a plurality of first through holes positioned to one side of a central axis of the conductive layer, and a plurality of second through holes positioned to another side of the central axis.

19. The display apparatus of claim 18, wherein the first through holes and the second through holes are arranged in alternating manner along the direction in which the conductive layer extends.

20. The display apparatus of claim 19, wherein a first edge of the conductive layer comprises first concave portions each positioned corresponding to one of the second through holes, and a second edge of the conductive layer comprises second concave portions each positioned to correspond to one of the first through holes.

21. The display apparatus of claim 20, wherein the second protective layers cover the first concave portions and the second concave portions.

22. A display apparatus comprising:
a substrate comprising a bending area between a first area and a second area, the bending area of the substrate being bent or bendable about a bending axis;
an organic material layer positioned on the substrate and overlapping the bending area; and
a conductive layer extending from the first area to the second area through the bending area, positioned on the organic material layer, and comprising a plurality of through holes positioned corresponding to the bending area, wherein a continuous portion of the conductive layer completely covers a plurality of protrusions of the organic material layer.

23. A display apparatus comprising:
a substrate comprising a bending area between a first area and a second area, the bending area of the substrate being bent or bendable about a bending axis;
an organic material layer positioned on the substrate and overlapping the bending area;
a conductive layer extending from the first area to the second area through the bending area, positioned on the organic material layer, and comprising a plurality of through holes positioned corresponding to the bending area; and
protective layers spaced apart from one another, at least partially covering opposite sides of the through holes, and protruding into recesses of the opposite sides of the through holes.

* * * * *